United States Patent Office 3,829,315
Patented Aug. 13, 1974

3,829,315

METHODS FOR MAKING HALF-TONE PRINTS

Gunther Schadlich, Wiesbaden-Biebrich, Renate Haenisch, Wiesbaden, and Roland Moraw, Wiesbaden-Biebrich, Germany, assignors to Kalle Aktiengesellschaft, Wiesbaden-Biebrich, Germany No Drawing. Application Sept. 8, 1971, Ser. No. 178,828, which is a continuation of application Ser. No. 732,024, May 27, 1968, now abandoned. Divided and this application Oct. 20, 1972, Ser. No. 299,185
Int. Cl. G03f *7/02, 7/24, 5/00*
U.S. Cl. 96—33 4 Claims

ABSTRACT OF THE DISCLOSURE

This invention relates to a method for the production of a printing plate capable of reproducing continuous tones, wherein a light-sensitive material suitable for the production of a printing plate is exposed under a continuous tone original, exposure light being caused to traverse a layer which presents sufficiently uniformly distributed areas of 0.05 to 10 microns in diameter, the light-transmission capacity of which areas contrasts with that of their immediate environment, this contrast layer being of the nature of a so-called shadow pattern, and the exposed material is developed and, if desired, etched.

This is a division of application Ser. No. 178,828, filed Sept. 8, 1971, which is, in turn, a continuation of Ser. No. 732,024, filed May 27, 1968, now abandoned.

This invention relates to improvements in and relating to methods for making continuous tone prints.

It is known that, for producing lithographic or intaglio printing plates, use can be made of a material having a light-sensitive copying coating, and that such material is exposed under an original to be reproduced, is then developed and, if necessary, etched.

It is also known, for the production of a printing plate reproducing continuous tones, to cause a finely divided shadow pattern, together with the exposure pattern, to fall upon the copying layer during exposure, by causing the exposure light to pass through a pattern of fine, closely juxtaposed, crossed lines which do not transmit light or reduce the strength of the light, this pattern being known as a screen. Instead of line screens, dot screens can also be used; in these, dots which do not transmit light or which reduce its strength are disposed in a uniform lattice arrangement.

There must be a certain minimum distance between the lines or dots comprising the screens. Many of the fine details of a continuous tone picture therefore can be reproduced only incompletely. Thus, for continuous tone reproductions of lower quality, screens having 30 lines or dots per cm. of length are used, i.e., the so-called 30 screen; for finer prints 60 screens are employed and in exceptional cases 120 screens. The latter can be produced only by experienced and skilled technicians. Screens having a still greater degree of fineness cannot be produced in a manner suitable for practical use. A further disadvantage of many screened continuous tone printing plates is the fact that a so-called moiré effect occurs which affects reproduction of the picture in a manner that is usually not desired. A further disadvantage is that production of the necessary screen films is relatively expensive.

It is also known to print continuous tone pictures by the offset process from aluminum plates with fine-grained surfaces, without the use of a screen pattern. In this case printing is done "from the grain of the plate." The printing process is known as "screen-less offset printing." This process is free from the three disadvantages mentioned above, but another disadvantage, causing great difficulties, is associated therewith, in that it enables only relatively few shade gradations to be reproduced. Also, no procedure is yet known for obtaining printing plates in a reliable manner. Furthermore, the number of prints obtainable from a plate is relatively small.

The present invention provides a method for the production of a printing plate capable of reproducing continuous tones, wherein a light-sensitive material suitable for the production of a printing plate is exposed under a continuous tone original, the exposure light being caused to traverse a layer which presents sufficiently uniformly distributed areas of 0.05 to 10 microns in diameter of which the light-transmission capacity contrasts with that of their immediate environment, this contrast layer being of the nature of a so-called shadow pattern, and the exposed material is developed and, if desired, etched.

This method of printing does not involve the drawbacks of screen printing, but permits, in a reliable manner, the reproduction of a greater contrast range than the simple screen-less offset printing process and, furthermore, also can be used in lithographic and intaglio printing.

The method according to the present invention, as in the known screen processes, employs exposure by means of a light-transmitting diaphragm which produces a finely distributed shadow pattern. In the method according to the invention, however, the finely distributed shadow pattern produced is formed of smaller areas than in the case of the screen process, i.e. of areas 0.05 to 10 microns in diameter, whereas, with the known dot screen, the diameter of the dots is well in excess of 10 microns. The areas providing the shadow pattern in the case of the known screens are of equal size to one another, whereas in the method of the invention they may be of different sizes. Furthermore, in the method according to the invention, in contrast to the regular periodic repetition of the arrangement of known screen patterns, the areas producing the shadow pattern are preferably distributed in a random manner. This affords the advantage that it is very much easier in most cases to produce the areas providing the shadow pattern. The use of materials in which the areas producing the shadow pattern are arranged with periodically repeated regularity, for example at the same distance apart, is included in the method of the invention as long as the areas have a diameter of 0.05 to 10 microns.

The light-transmission capacity of the areas producing the shadow pattern contrasts with that of their immediate environment. The areas are thus capable of transmitting either less light or more light than is their immediate environment. In the first case, the areas, and in the second case, the immediate environment of the areas, can be completely impenetrable by light. The random distribution of the areas of course also includes the possibility of the individual areas overlapping one another. The size of the total area of greater light-transmitting capacity formed by the small individual areas also can vary within wide limits in relation to the size of the total area of lower light-transmission capacity. The ratio between the two is, however, normally between 1:9 and 9:1. It is preferable if the total area of greater light-transmission capacity is less than or approximately equal to the total area of the places throwing the shadows. The preferred ratio of light spots to shadow spots is between 4:6 and 5.5:4.5.

The method according to the invention can be carried out in different ways. Thus, in the method for producing a printing plate for reproducing continuous tones, during exposure, for producing the shadow pattern, a film can be placed between the light source and the copying coating, which film is provided with the areas having a light-transmitting capacity which contrasts with their environment. The film can be laid directly on the copying coating or it can be laid over the copying coating and separated therefrom by the continuous tone original. Instead, a coating incorporating the areas producing the shadow pattern can be carried directly on top of the copying coating. Alternatively, the copying coating itself can incorporate the areas producing the shadow patterns. If an objective, e.g. a projector, is used for the exposure, then the coating provided with the areas is arranged in the plane of the image or in its immediate vicinity.

The brighter the part of the image of the continuous tone original, used during exposure, the greater is the amount of light reaching the corresponding part of the image on the printing plate during exposure and the stronger is the radiation penetrating beneath the intermediate shadow-projecting areas supplying the shadow pattern. This penetration of the shadow-projecting areas, which increases with exposure time, brings about the continuous tone effect. It should be particularly stressed that the other good properties of the printing plates, such as developability and abrasion resistance during printing are not adversely affected by the method of the invention.

There are many possible ways of producing the coating comprising the areas the light-transmission capacity of which contrasts with that of their environment. For example, areas of lesser light-transmitting capacity and distributed in a random manner can be obtained by treating transparent films with a sandblast or by surface roughening, and the depressions thereby formed can, in part, be filled with pigment materials for enhancing the contrast in light-transmission capacity. Films of transparent materials can be cast or extruded with pigment substances embedded therein. The desired result is also achieved by a partial vapor treatment of a transparent carrier or of the material serving to produce the printing plates, using metals or other optically masking materials, or such materials can be deposited chemically or electro-chemically through a mask containing perforations of appropriate number and size. Another method consists in spraying with colorant particles or other optically dense substances. It is possible instead to burn holes, distributed in a dense random arrangement and of a few microns in diameter, by means of focused electron beams, into a transparent film metallized or pigmented over its entire surface. Fabrics of appropriate fineness can be used as ultra-fine periodically recurrent patterns. Exposure through sheets or bundles of glass fibers also can lead to the desired continuous tone reproduction, since such glass fibers can be produced from light-conducting nuclear fibers in diameters as low as 10 microns. By using such light conductors it is possible to bridge fairly large gaps between the original and the printing plate. Metals deposited in finely particulate form embedded in binding agents, for example photographic films exposed over their entire surface and developed, or coatings of pigments in finely particulate form on transparent films or on the printing plate itself can be used as the material for producing the shadow pattern.

Coatings of pigment or metal grains can be applied without complicated technical means, so that their use for carrying the invention into effect is of considerable importance. Apart from the question of grain size, the choice of pigments is practically unlimited. When using colorless pigments, e.g. powdered glass or glass beads, care must be taken to prevent fine dark portions of the image being at the same time under-penetrated due to over-long exposure, since these pigments preferentially scatter the irradiation light in a diffuse manner and do not absorb it. The necessary exposure times are quite short. Dark, or even black pigments, such as fine carbon black, absorb over the entire visible and adjacent ultraviolet spectrum range. A disadvantage here, however, is that, as a consequence of the intense absorption of light, the dark coating heats up considerably so that, upon exposure in the copying frame, due to the good contact with the copying coating, the latter becomes heated undesirably. It is therefore better to use those pigments that absorb only in the spectrum sensitivity range of the copying coating. In the case of copying coatings comprising aromatic diazo compounds and azido compounds, as well as with many polymerizable photographic coatings, it is therefore advantageous to employ yellow to yellow-brown pigments.

In the practical application of the method, the size of the areas providing the shadows is very important. If pigments are used as the screen substances, the most suitable grain sizes can be arrived at relatively simply by sorting. It has been found that the most advantageous size range is between 0.5 tond 10 microns grain diameter. It is difficult to determine whether there are useful extensions of this range in the directions of larger or smaller values, since there is a certain distribution of grain size in the coating. Good results have been obtained with a yellow pigment in respect of which the manufacturers quote a mean grain diameter of 0.48 micron. This pigment was dispersed in water, together with wetting agents and water-soluble binders, in a ball mill. The diameters of the largest particles in dried coatings of this dispersion were assessed at about 5 microns when observed under the microscope. The pigment particles must, on the other hand, be distinctly smaller than the screen dots of the much used 60 screen, since otherwise shadow areas, as large as these screen dots, no longer can be under-penetrated in reasonably short exposure times and they cause correspondingly large flecks on the printing plate. The pigments however should not be too fine, since otherwise they produce a haze effect, which lengthens the exposure time. As tests with pigments having the appropriate degrees of fineness have shown, the lower permissible limit for grain size is roughly 0.05 micron. Whether coarser or finer pigments are used, within the recited particle size range, will depend upon the purpose for which the process is used. Pigments that are too coarse, however, cause pronounced structuring of the picture, so that the use of pigments including particles of diameters greater than 10 microns is best avoided.

The above considerations regarding the most favorable particle size range of the shadow-forming areas in pigment coatings also apply in the case of other coatings, for example vapor-deposited metal coatings. The method for determining the optimum pigment density, to be described later, applies in an analogous manner to the production of other coatings, for producing the shadow pattern. In general, it has been observed that the reproduction of continuous tones is better with a pigment coating of up to a certain thickness, the necessary exposure times also becoming longer. Good results are no longer obtained with pigment coatings that are too thick. For a given pigment layer arrangement and a given pigment composition it is possible to determine the optimum pigment density, for example, by increasing the pigment density until, upon printing the image-wise exposed and developed printing plate, the image of the original is repoduced with the correct illumination distribution. Under the conditions used in Example 5 below, the weight of coating amounts, for example, to about 100 mg. for a size given by German Standard Specification DIN A 4. The most advantageous thickness of pigment coating and/or the best type of pigment are difficult to predict for an individual case. It can be taken, however, as a general indication that the ratio of the open to the covered area should not be much greater than 1; preferably, the covered area should be greater than the open area. The complete printing system, including printing plate, printing machine and paper, with correct adjustment, operates with a gradation of 1. Accordingly, by varying the density of the pigment, the printing system can be made to give harder or softer results, and it is even possible, if required, to perform tone value corrections. The problem is usually to reduce the gradation of the printing system by the above-described measures. It has been found that the exposure time is thereby increased to roughly three or four times the exposure time required when no pigment coating is present.

Coatings containing pigment must incorporate a binding agent, so that the pigment adheres and cannot be wiped off.

When the pigment coating is applied to the copying coating of the material for producing the printing plate, the binding agents used must be such that the pigment coating is removed when developing the exposed material with the developer solution. The binding agents employed preferably should be soluble only in acid or better still, only in alkaline aqueous solutions, so that the applied pigment coatings are resistant to handling. The binding agents and the pigment materials must, of course, be compatible with the light-sensitive coating and, if necessary, stabilizing agents may be added. In the case of light-sensitive coatings based on diazo compounds, these are generally organic acids. The binding agents must meet no other special requirements, so that there is a large selection available. Binding agents that are soluble only in organic solvents can be used if the necessary solvents do not attack the printing plate material coating or support.

A particular advantage of partly light-transmitting metallic coatings is the fact that they do not become appreciably heated even when exposed to light for a fairly long period, since they do not absorb the radiated light. In the same way as pigment coatings, metals in the form of fine grains embedded in binding agent can be applied to the material for producing printing plates. Metals can be obtained in the form of fine grains by reducing corresponding metallic salts. Technically produced pigments usually must be dispersed in the binding agent solution by means of a ball mill, and isolated coarse particles of pigment find their way into the suspension. With coatings of metal grains produced in the same way, however, particles are obtained the upper size limit of which is better controlled. Prints from printing plates produced with such metal grain coatings therefore appear very smooth and attractive. Particularly uniform, fine-grained metal coatings are obtained by applying the art of photographic film manufacture, by reacting silver nitrate with potassium bromide in a binding agent to produce silver bromide, followed by ripening and exposing and developing the washed emulsion. The required grain size can be obtained by the ripening treatment.

The continuous metallization of continuous strip material in a vacuum is well known. Care must be taken in the application of this method that, during the vapor treatment, masking areas are formed of the size referred to in the case of pigment coatings. In this connection a fine cluster of jets of metal can be confined and directed in pulses upon the material to be vapor-treated, or the metal-vapor treatment can be applied through a suitable screen. A still simpler method is by vapor-treatment applied obliquely to the normal to the surface. Printing plate supports such as aluminum are often roughened before application of the light-sensitive coating, the rough surface structure being largely retained through the applied light-sensitive coating. With the oblique vapor-treatment, metal is accordingly preferentially deposited on the peaks. The same effect is achieved in the oblique vapor-treatment of superficially roughened films. When a material for producing the printing plates, and intended later to be developed with an aqueous developer solution, is treated directly with metal vapor, it is advantageous to apply a thin and very readily water-soluble coating to the material so that, after exposure, the metallic coating can be more easily lifted by rinsing during the aqueous developing operation, and thus removed. The amount of metal to be vapor-deposited is determined by tests similar to those described above for determing the thickness of pigments. Similar considerations apply as regards the density of metallic coatings which are deposited chemically or electrochemically.

The above-described procedures are suitable for producing positive and negative offset printing plates. Relief and/or intaglio printing plates also can be produced. In the etching operation however, fine dots on the screen easily can be under-etched and their mechanical stability is low. In the case of offset printing plates, the method is independent of the printing plate support. Use can be made of completely smooth supports such as multi-metal plates, polished aluminum, mechanically roughened carriers, carriers of anodized aluminum and also paper supports. The best results have been obtained with smooth or moderately roughened supports, of which the depth of the roughening is up to about 1 micron. As described in the Examples below, up to eight steps of the "Kodak" (Registered Trade Mark) No. 2 Photographic Step Wedge can be reproduced in the printing, this corresponding to the tone-graded reproduction of a nominal density of 1.2. However, this certainly does not mean that this is the limit of the performance of the method.

To obtain satisfactory results, the correct exposure time must be selected in a more precise manner than in the case of methods employing a screened original, if bright as well as dark toning is to be reproduced with gradation. Also, the correct setting of the printing system as regards the supply of damping water and ink contributes to obtaining optimum results by the continuous tone reproduction method according to the method of the invention. High quality paper with sealed surfaces is also particularly suitable.

The following Examples further illustrate the invention:

Example 1

Commercially available materials for producing offset printing plates, provided on a brush-roughened aluminum support of about 2 to 3 microns roughened depth with a positive working copying coating, in which is contained, as the light-sensitive substance a naphthoquinone diazide sulfonic acid ester, are coated in a centrifuge with aqueous dispersions in which carbon black, active carbon or other black pigments are dispersed with the sodium salt of diisobutylnaphthalene sulfonic acid being added as a wetting agent. Dispersions of benzene of black printing ink and electrophotographic developer (toner) were also used for the coating. Viewed under the microscope, the pigment particles on the dried coatings are between 5 and 10 microns in size. In accordance with the directions contained in the above general description, the density of the pigment particles is kept at a level such that the continuous tones are reproduced in the optimum manner. After exposure under an arc lamp and a "Kodak" Photographic Step Wedge No. 2 with a density increment of 0.15 per step, and after developing and inking up with greasy, black printing ink, several tone-graded steps more are observed than in the commercial material without the pigment coating. The exposure time for the pigmented printing plate material is longer, however. The plates coated with the aqueous dispersions are not fast to wiping, but the pigment coating must be washed off with benzene before development with the alkaline developer can be carried out.

Example 2

A light-sensitive material of the kind used in Example 1 is coated with a preserving lacquer which is an aqueous solution of cellulose ether and gum arabic, and the layer in the tacky condition is dusted with a pigment. The dry printing plate is fast to wiping. The further treatment and the results obtained are similar to those described in Example 1. The pigment used was carbon black having a particle size range of 2 to 10 microns.

Example 3

A light-sensitive material of the kind used in Example 1 is provided with a pigment coating of the following composition: 20 g. of poly-N-vinylpyrrolidone and 2 g. of diisobutylnaphthalene sulfonic acid sodium salt are dissolved in 300 ml. of warm water; 12 ml. of black India ink are added to this solution. The suspension is put through a coarse filter and the filtrate is poured onto the rotating printing plate material (160 r.p.m.). The air movement produced by the rotation promotes drying. The pigment particles in the dried coating are less than 1 micron.

The material coated in this way is exposed for 15 minutes under an arc lamp and under a "Kodak" Photographic Step Wedge No. 2 with a density increment of 0.15 per step. After this time, full exposure of the material is just completed under the first step. The pigment coating is washed off with water and the material is developed by immersion for 1 minute in an aqueous alkaline developer. After inking up with greasy, black printing ink, nine to ten tone-graded steps can be seen on the printing plate, of which about eight are reproduced upon printing. The extraordinarily long exposure time is attributable to the very fine particles employed.

A printing plate material without a pigment coating, but otherwise treated in the same way, requires an exposure time of about 1 minute and shows up to four steps, of which about three are reproduced upon printing.

Example 4

A light-sensitive material of the kind used in Example 1 is provided with a pigment coating of the following composition: 20 g. of poly-N-vinylpyrrolidone, 2 g. of diisobutylnaphthalene sulfonic acid sodium salt and 9 g. of Fixoplast Yellow S 501 opaque (a yellow pigment supplied by Farbenfabriken Bayer AG., Leverkusen, Germany) are dissolved or suspended in 300 ml. of warm water and the product allowed to stand for a few minutes, whereby the coarse particles settle out. The supernatant liquid is poured on the rotating printing plate material (160 r.p.m.). The air movement occurring during rotation promotes drying. After drying, a coating is obtained which comprises particles having an estimated diameter of 1 to 5 microns and a surface covering of about 50%.

The printing plate material coated in this way is exposed for 3 minutes under an arc lamp and under a "Kodak" Photographic Step Wedge No. 2 with a density increment of 0.15 per step. After this period, the printing plate material is just fully exposed under the first step. The pigment coating is washed off with water and the printing plate material is developed by immersing for 1 minute in an aqueous alkaline developer. After inking up with greasy, black printing ink, nine tone-graded steps can be seen, of which about seven are reproduced upon printing. Continuous tone prints of good tone value gradation and resolution capacity are reproduced.

A printing plate having no pigment coating, but otherwise treated in the same way, requires an exposure time of about 1 minute and shows about four steps of which about three are reproduced upon printing.

Example 5

A light-sensitive material of the kind used in Example 1 is provided with a pigment coating as follows:

1 ml. of "Arcopal" N 100, a wetting agent, marketed by Farbwerke Hoechst AG., Germany, based on nonyl phenol, oxidized with a 10-fold molar amount of ethylene oxide, is dissolved in 80 ml. of warm water, and while stirring vigorously, 2.5 g. of Hansa Yellow 10 G (Farbwerke Hoechst AG.) are added this being a yellow monoazo pigment (Color Index No. 11,710) having a grain diameter of about 0.48 micron. After complete dispersion, a binding agent suspension, that has been well mixed while stirring, is added also with stirring. This suspension consists of 1 g. of poly-N-vinyl-N-methyl-acetamide (K=88.1) in the form of a 10% aqueous solution and 1 g. of polyvinyl acetate, also in the form of a 10% aqueous solution. In all, the suspension thus amounts to 100 ml. This is ground for at least 3 hours in a ball mill until a uniform distribution is obtained. The suspension is used immediately.

The printing plate material is coated by means of a doctor (0.1 mm. gap) and dried in air. It is possible instead to apply the coating using a centrifuge, but in that case the proportion of pigment must be approximately doubled. After drying, a coating comprising particles having a mean diameter of about 5 microns is obtained.

The coated printing plate material is exposed for about 4 minutes under an arc lamp and under a "Kodak" Photographic Step Wedge No. 2 having a density increment of 0.15 per step; the printing plate is then just fully exposed under the first step. After washing off the pigment coating with water, and then developing by immersion for 2 minutes in an aqueous alkaline developer and inking up with greasy, black printing ink, nine to ten graded steps can be observed. Upon printing, seven to eight steps are reproduced. Continuous tone originals give reproductions having good gradation agreement and resolution capacity.

A printing plate material, having no pigment coating, but otherwise similarly treated, requires a period of about 1 minute under the first step to give a corresponding full exposure. After developing and inking up, about 3 to 4 steps can be seen, of which up to 3 are reproduced upon printing.

The picture becomes somewhat smoother and the developing easier, if, prior to applying the pigment suspension, the printing plate material is given a preliminary coating consisting of a solution of a water-soluble binding agent, for example a 5% solution of poly-N-vinyl-N-methyl acetamide.

Example 6

The same procedure is used as that described in Example 5, but a negative working offset printing plate material is employed, the copying coating of which contains, as the light-sensitive substance, a *p*-iminoquinone diazide (in accordance with German Patent Specification No. 1,104,824). The printing plate material, provided with the coating of Hansa Yellow pigment, requires an exposure time of 45 sec. After developing, with aqueous alkaline developer and after inking up, six gradation steps can be seen.

A material which is the same except that it has no pigment coating, requires 15 sec. for the exposure and shows only about 1.5 steps.

Example 7

The same procedure is used as for Example 5, but a positive working offset printing plate material is used, of which the aluminum support is not mechanically roughened, but is oxidized by electrolytic treatment.

The printing plate material, provided with the coating of Hansa Yellow pigment, requires an exposure time of 6 min. After development with the aqueous alkaline developer and after inking up, four or five gradation steps can be seen.

A material that is the same except that it has no pigment coating, requires a development time of 1 min. and shows only about two steps.

Example 8

A polyethylene terephthalate film, rendered matte by abrasion to give a roughened depth of up to 5 microns, is provided with a pigment layer of Hansa Yellow 10 G by the procedure given in Example 5. The film, together with the pigment coating, is applied to the copying coating of a light-sensitive material of the kind used in Example 1, a "Kodak" Photographic Step Wedge No. 2 is laid thereon, and exposure carried out in a vacuum frame under an arc lamp. With the film applied, it is necessary to expose roughly four times longer than when exposing without application of the film. On the printing plate exposed under the pigment coating, then developed and inked up, two extra steps can be seen in comparison with a printing plate treated in exactly the same way except that it was not exposed under a pigment coating.

Similar results are obtained when a clear cellulose acetate film is used instead of the matte polyester film.

Example 9

The same procedure as in Example 5 is followed, but, as the yellow pigment, there are added 3 g. of Permanent Yellow GG extra (Farbwerke Hoechst AG.), a yellow diazo pigment (Color Index No. 21,105) having a grain diameter of about 0.05 micron. On the dried printing plate material there is obtained a layer comprising particles of up to 1 micron in diameter, but mostly finer.

After exposure for 12 minutes followed by developing and inking up, eight steps can be seen. A similar material, without a layer of pigment, requires an exposure time of 1 minute and reproduces up to four steps.

The extraordinarily long exposure time is attributed to the very small size of the particles of the pigment employed.

Example 10

A commercial positive working offset printing plate material of the kind used in Example 1 is coated by the method of Example 5 with a pigment suspension produced as follows: 6.25 g. of barium chloride and 6.6 g. of aluminum sulfate (with 18 moles of water of crystallization) are dissolved separately, each in 20 ml. of water. The two solutions are poured together without stirring and left to stand for several hours. During this time barium sulfate in the form of very fine flock precipitates and settles. The supernatant liquor is then decanted and replaced by the same quantity of distilled water. To this dispersion is added 0.5 ml. of "Arcopal" N 100 and 50 ml. of a 10% aqueous solution of poly-N-vinyl-N-methyl-acetamide (K=88.1) is added as a binding agent. The mixture is stirred vigorously for 1 hour to achieve a uniform distribution. The particles in the dried coating obtained with this dispersion have a diameter of 1 to 5 microns.

After 2 minutes exposure under a "Kodak" Photographic Step Wedge No. 2 having a density increment of 0.15 per step, the resulting offset printing plate material is developed with an aqueous alkaline solution and inked up with greasy, black printing ink. Nine gradation steps can be seen. The picture looks very smooth.

In the case of a similar plate without a pigment coating, an exposure time of 1 minute is required. Three steps are reproduced.

Example 11

A commercial positive working offset printing plate material of the type used in Example 1 is coated, in the manner described in Example 5, with a suspension consisting of 5 g. of finely divided silica (mean grain size about 5 microns), 50 ml. of water, 1 ml. of "Arcopal" N 100 and 50 ml. of a 10% aqueous solution of poly-N-vinyl-N-methyl-acetamide (K=88.1) and produced by grinding the constituents for 3 hours in a ball mill. The paticles in the coating are 5 to 10 microns in size.

The printing plate material thus coated with silica, after having been exposed for 2 minutes under a "Kodak" Photographic Step Wedge No. 2 having a density increment of 0.15 per step, is developed with an aqueous alkaline solution and inked up with greasy, black printing ink. Seven gradation steps can be seen. The continuous tone reproduction appears very smooth, 100,000 continuous tone prints of equal quality have been produced with such a printing plate.

An exposure time of 1 minute is required for a similar plate without the pigment coating. Only three steps are reproduced.

Example 12

A polyester film, for thin-film chromatography, having a coating of colorless silica gel, is placed coating to coating in contact with a commercial positive working offset printing plate material of the kind used in Example 1, and a continuous tone original is placed thereon. After exposure for 5 minutes under an arc lamp in a vacuum frame, and after developing and inking up with greasy, black printing ink, the continuous tones are readily visible. Naturally, the reproduction is somewhat less sharp, however.

A corresponding printing plate material which was exposed only under the continuous tone original required only 1 minute of exposure time, but reproduced the continuous tones poorly.

Example 13

Commercial positive working offset printing plate materials of the kind used in Example 1 were vapor-treated with silver at an angle of about 45°, in a vacuum (about 0.0001 mm. Hg), to give various thicknesses of coating. When the silver coatings are too dense the plate cannot later be correctly developed. If the silver coatings are too thin, the desired effect is only faintly discernible. With a medium density of the silver, and after exposure for 4 minutes under an arc lamp beneath an unscreened contiuous tone original, after developing and inking up with greasy, black printing ink, continuous tones such as clouds are reproduced true to the original. The pictures are very smooth.

A non-vapor-treated, but otherwise similar printing plate material requires an exposure time of 1 minute under otherwise similar conditions. Continuous tones such as clouds are reproduced in a poor manner.

When the printing plate materials are treated vertically with metal vapor, the reproduction of the continuous tones is somewhat poorer than in the case of oblique treatment.

To facilitate the developing of metal-vaporized printing plate materials, it is advantageous to provide the plate materials beforehand with a water-soluble coating such as, for example, a 0.5% aqueous solution of poly-N-vinyl-N-methyl-acetamide (K=88.1).

Example 14

Polyester films, the surface of which has been rendered matte to a roughened depth of up to 5 microns are treated with silver vapor in a vacuum and at an angle of about 45° to give various thicknesses of coating.

A polyester film metallized in this way is placed with the metal coating on the copying coating of a commercial positive working offset printing plate material, and a "Kodak" Photographic Step Wedge No. 2 is then placed thereon and finally exposure is carried out in a vacuum frame under an arc lamp. The best results were obtained with a metallized polyester film requiring an exposure time of 9 minutes. After developing and inking up the resulting printing plate, nine gradation steps could be observed. Without the application of the metallized polyester film only one minute of exposure time is required. Only three tone-graded steps are reproduced, however.

Similar results are obtained with vertically metallized matte films.

Example 15

A commercial positive working offset printing plate material of the kind used in Example 1 is coated in the manner described in Example 5 with a metallic grain suspension prepared as follows:

8.2 g. of silver nitrate are dissolved in 500 ml. of water, and 250 ml. of concentrated ammonia and 15 drops of 2–N caustic soda are added thereto. The resulting solution is stirred into a solution of 4.5 ml. of formaldehyde (30%) in 200 ml. of water. The silver, deposited in fine grains, is washed with water and ground for 24 hours in a ball mill in 50 ml. of a 10% aqueous solution of poly-N-vinyl-N-methyl acetamide (K=88.1) as a binding agent and 0.5 ml. of "Arcopal" N 100 as a wetting agent. In the dried coating, the deposited silver particles are mostly up to 5 microns in size and partly up to 10 microns.

The printing plate material coated in this manner is exposed for two minutes under an arc lamp beneath a "Kodak" Photographic Step Wedge No. 2, with a density increment of 0.15 per step. After developing with an aqueous alkaline developer and inking up with greasy, black printing ink, eight gradation steps can be recognized. The picture appears very smooth.

Without the coating of metal grains, an exposure time of 1 minute is required for the same printing plate material and the developed and inked up printing plate gives only about three such steps.

Example 16

A transparent cellulose acetate film is coated with the fine-grained metal dispersion of Example 15.

The coated cellulose acetate film is placed with the coating on the copying coating of a comercial positive working offset printing plate material of the kind used in Example 1 and a continuous tone original is laid thereon. Exposure takes place in a vacuum frame under an arc lamp. The exposure times and the continuous tone reproduction are similar to those given in Example 15.

Example 17

An acetate film is coated by wiping it over with a 5% solution of poly-N-vinyl-methyl acetamide in water and then evenly dusted, through a sieve having a mesh having a mesh of about 30 microns, with colorless glass beads which are between 5 and 30 microns in size, so that a densely packed layer of glass beads adheres to the tacky acetate film. After drying, a commercial positive working printing plate material of the kind used in Example 1 is exposed with a continuous tone original laid directly on the plate and with the above-described film placed on top. After an exposure time of 2 minutes under an 18 amp arc lamp at a distance of 60 cm. in a vacuum frame, and after developing for 1 minute with an aqueous alkaline developer and inking up with greasy, black printting ink, a printing plate is obtained which equals the original as regards tone values and resolution capacity.

Example 18

A commercial positive working offset printing plate material of the kind used in Example 1 is thinly smeared with with a 5% aqueous solution of poly-N-vinyl-methyl-acetamide and is evenly dusted, through a sieve having a mesh of about 30 microns, with colorless glas beads as in Example 17. After drying, exposure takes place for 2 minutes in a vacuum frame under an 18-amp arm lamp at a distance of 60 cm. through a continuous tone original. After rinsing off the glass bead layer with water, developing for 1 minute with an aqueous alkaline developer and inking up with greasy printing ink, a printing plate is obtained which equals the original as regards tone values and resolution capacity.

Example 19

2 g. of colorless glass beads having a particle size of 5 to 30 microns are suspended in 10 ml. of glycol monomethyl ether. 40 ml. of an acetate lacquer solution, consisting of about 13% of cellulose triacetate and about 87% of a solvent consisting of 97.5 parts by weight of methylene chloride and 2.5 parts by weight of isopropanol, are added thereto and dispersed evenly by stirring and a film is cast on to a glass plate with the help of a doctor (1 mm. gap). After the film has dried, exposure takes place for 2 minutes in a vacuum frame under an 18 amp arc lamp at a distance of 60 cm, the film, as described above, being laid on a commercial positive working offset printing plate material of the kind used in Example 1, and a continuous tone original being laid on top. After developing for 1 minute with an aqueous alkaline solution and then inking up with greasy, black printing ink, a printing plate is obtained which equals the original as regards tone values and resolution capacity.

Example 20

In the manner described in Example 5 a covering layer of Hansa Yellow 10 G is applied to a completely smooth aluminum foil support, which, to reinforce the mechanical strength is backed with stiff paper, and which is provided with a light-sensitive layer which contains as a light-sensitive substance an *o*-naphthoquinone diazide sulfonic acid ester produced in accordance with British Patent Specification No. 1,039,475.

The printing plate material coated in this manner is exposed for 1.5 minutes under an arc lamp beneath a "Kodak" Photographic Step Wedge No. 2 having a density increment of 0.15 per step. After washing off the pigment layer with water, immersing for 2 minutes in an alkaline-aqueous developer and inking up with greasy, black printing ink, six gradation steps can be observed.

A printing plate material without the pigment coating, but otherwise similar, is fully exposed in about a half-minute but reproduces only two to at most three such steps.

Example 21

To a plate of electrolytically roughened aluminum having an oxide coating 2 to 3 microns thick, there is applied a negative working light-sensitive coating in accordance with German Patent Specification No. 1,106,181, Example 1, which coating consists of epoxide resins, which are condensed with tartaric acid and esterified with cinnamic acid, and also contains Michler's ketone. A coating of finely divided silica, as in Example 11, is applied to this coating. After exposure under an arc lamp for 6 minutes under a "Kodak" Photographic Step Wedge No. 2 having a density increment of 0.15 per step, followed by immersion for 1 minute in a dioxane developer and wiping with an alkaline-aqueous developer, five gradation steps can be seen after inking up with greasy, black printing ink.

A photo-polymerizable printing plate material, without the covering layer of silica, but otherwise produced and treated in exactly the same way, is exposed in 2 minutes but shows only two steps after developing.

Example 22

To a plate of brushed aluminum, in the manner specified in Example 1 of German Patent Specification No. 838,699, is applied a negative working light-sensitive coating which, in addition to binding agents such as poly-N-vinylpyrrolidone and dyes such as eosin, also contains as a light-sensitive compound 4,4'-diazido-stilbene-2,2'-disulfonic acid sodium salt. A "Kodak" Photographic Step Wedge No. 2 having a density increment of 0.15 per step is laid on this coating in the place of an original and on this there is placed a cellulose acetate film having a coating of finely divided silica as in Example 11. After exposure for 2 minutes under an arc lamp and immersing in methanol for 1 minute for development, followed by inking up with a 0.5% methyl violet solution in equal parts of water and methanol, ten gradation steps can be observed.

An exactly similar offset printing plate material, apart from the presence of the covering layer of silica, requires only 1 minute exposure time, but shows only about five steps after inking up.

Example 23

An etchable light-sensitive printing plate material having a zinc support, made in accordance with German Patent Specification No. 1,195,166, with a copying layer containing as a light-sensitive substance, an *o*-naphthoquinone diazide sulfonic acid ester and about three times as much novolak resin, is exposed for 3 minutes under an arc lamp and under a "Kodak" Phographic Step Wedge No. 2 having a density increment of 0.15 per step, and under a film dusted with fine glass beads as in Example 19. After developing for 3 minutes in an aqueous-alkaline developer, to which about 15% by volume of methyl glycol is added, the plate is dried and is etched for 6 minutes by the conventional single-stage method at 27° C. with dilute nitric acid, using an edge protecting agent. In this way one step is etched out having a fine grain.

When the same etchable light-sensitive printing plate material was provided with a coating of finely divided silica as in Example 11, the exposure time was 4 minutes and, upon etching, one fine-grained step was obtained.

With the same light sensitive printing plate material, only 2 minutes are required for exposure beneath a photographic step wedge without using a coating providing a shadow pattern, and under the same etching conditions as above no step is etched out.

Example 24

A commercial positive working offset printing plate material of the kind used in Example 1 is exposed for 1 minute under an arc lamp in a vacuum frame under a "Kodak" Photographic Step Wedge No. 2 having a density increment of 0.15 per step and under a polyamide cloth of colorless filaments, about 10 microns thick, having a 10 micron mesh. After treatment in an alkaline developer and inking up with greasy, black printing ink, six gradation steps can be seen.

A similar printing plate material, minus the polyamide cloth, but otherwise similarly treated, required an exposure time of 30 sec. and reproduced only four steps.

Example 25

A commercial positive working offset printing plate material of the kind used in Example 1 is exposed in a vacuum frame for 2.5 minutes under an arc lamp, under a "Kodak" Photographic Step Wedge No. 2 having a density increment of 0.15 per step, and also under a fine copper mesh. The copper mesh consists of a copper foil, about 8 microns thick, having a mesh width of about 30 microns and webs about 7 microns wide. The copper mesh becomes strongly heated during the exposure and transmits the heat to the printing plate, this being thereby damaged. To obviate this effect, a filter glass (KG 3), suitable for absorbing thermal radiation, and a filter glass (BG 12) suitable for absorbing the non-actinically effective visible radiation were interposed, both being 2 mm. thick and being produced by the Jenaer Glaswerke Schott und Gen., Mainz, Germany. After alkaline development and inking up with greasy, black printing ink, five to six gradation steps can be observed.

When the copper mesh and filters are not used, only 30 seconds are required for the exposure, but only four steps are reproduced.

Example 26

A commercial positive working offset printing plate material of the kind used in Example 1 is exposed for 20 seconds under an arc lamp and under an acetate film coated with finely divided silica as in Example 11. A sample, taken from the printing plate material after this exposure treatment, is subjected for 2 minutes to alkaline development and, after inking up with greasy, black printing ink, exhibits substantially the full tone. The printing plate material, pre-exposed in this way, after any length of storage time, is further exposed for 1 minute beneath a "Kodak" Photographic Step Wedge No. 2 having a density increment of 0.15 per step. After alkaline development and inking up with greasy, black printing ink, seven to eight gradation steps can be observed.

Corresponding results with similar exposure times are obtained in the case of pre-exposure beneath a film with glass beads embedded therein, the film being produced as in Example 19.

Without pre-exposure, i.e. for the exposure of the commercial material beneath a "Kodak" Photographic Step Wedge only, a period of 1 minute is required for corresponding full exposure. After alkaline development and inking up with greasy, black printing ink, three to four gradation steps can be seen.

It will be obvious to those skilled in the art that many modifications may be made within the scope of the present invention without departing from the spirit thereof, and the invention includes all such modifications.

What is claimed is:

1. A process for the production of a printing plate capable of reproducing continuous tones which comprises exposing under a continuous tone original a light-sensitive layer on a base suitable for the production of a printing plate, the light-sensitive layer being coated with a contrast layer containing particles of a pigment of a diameter in the range of 0.05 to 10 microns, the particles being distributed in the contrast layer so as to cover 10 to 90 percent of the light-sensitive layer and the exposure light being unscreened and traversing the contrast layer before it traverses the light-sensitive layer, and developing the resulting image.

2. A process according to claim 1 in which the contrast layer comprises a binding agent soluble in an alkaline solution.

3. A process according to claim 1 in which the light-sensitive layer comprises a sensitizer selected from the group consisting of aromatic diazo and azido compounds, and photopolymerizable compounds.

4. A process according to claim 2 in which the particles of the contrast layer are yellow pigments.

References Cited

UNITED STATES PATENTS

| | | | |
|---|---|---|---|
| 1,161,824 | 11/1915 | Morris | 96—116 |
| 1,849,036 | 3/1932 | Ernst | 96—116 |
| 2,150,805 | 3/1939 | Meulendyke | 96—116 |
| 3,130,669 | 4/1964 | Cooke | 96—116 |
| 3,148,064 | 9/1964 | Rauner et al. | 96—36 |
| 3,530,779 | 9/1970 | Alofs | 96—81 |

DAVID KLEIN, Primary Examiner

U.S. Cl. X.R.

96—38, 45

UNITED STATES PATENT OFFICE
CERTIFICATE OF CORRECTION

Patent No. 3,829,315 Dated August 13, 1974

Inventor(s) Gunther Schadlich, Renate Haenisch, and Roland Moraw

It is certified that error appears in the above-identified patent and that said Letters Patent are hereby corrected as shown below:

Column 1, after line 10, the following should be inserted:

--- Claims priority, application Germany , May 26, 1967, K 62 378 IXa/57d ---

Column 3, line 68, "irradiation" should read --- irradiated ---.

Column 4, line 11, "screen" should read --- screening. Line 14 "tond" should read --- and ---. Line 34, "degrees" should read --- degree ---.

Column 11, line 47, "glas" should read --- glass ---.

Signed and sealed this 17th day of December 1974.

(SEAL)
Attest:

McCOY M. GIBSON JR.
Attesting Officer

C. MARSHALL DANN
Commissioner of Patents

RM PO-1050 (10-69)

USCOMM-DC 60376-P69
☆ U.S. GOVERNMENT PRINTING OFFICE : 1969 O—366-334.